(12) United States Patent
Ikeda

(10) Patent No.: US 10,367,501 B1
(45) Date of Patent: Jul. 30, 2019

(54) SEMICONDUCTOR DEVICE

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 16/115,864

(22) Filed: Aug. 29, 2018

(30) Foreign Application Priority Data

Mar. 20, 2018 (JP) .................................. 2018-053571

(51) Int. Cl.
| | | |
|---|---|---|
| *H03K 17/687* | (2006.01) |
| *H01L 29/78* | (2006.01) |
| *H01L 29/778* | (2006.01) |
| *H01L 29/20* | (2006.01) |

(52) U.S. Cl.
CPC ...... *H03K 17/6871* (2013.01); *H01L 29/2003* (2013.01); *H01L 29/778* (2013.01); *H01L 29/7827* (2013.01)

(58) Field of Classification Search
CPC .............. H03K 17/687; H03K 17/6871; H01L 29/2003; H01L 29/778; H01L 29/7827
USPC .... 327/108–112, 427, 434, 437; 326/82, 83, 326/87
See application file for complete search history.

(56) References Cited

U.S. PATENT DOCUMENTS

| | | | | |
|---|---|---|---|---|
| 9,142,544 | B2* | 9/2015 | Ikeda | .................. H01L 27/0255 |
| 9,601,483 | B2* | 3/2017 | Ikeda | .................. H01L 27/0629 |
| 9,653,449 | B2 | 5/2017 | Ikeda | |
| 2014/0027785 | A1* | 1/2014 | Rose | ................ H03K 17/08122 257/77 |
| 2014/0284662 | A1 | 9/2014 | Ikeda | |
| 2015/0357321 | A1 | 12/2015 | Ikeda | |
| 2016/0005725 | A1* | 1/2016 | Ikeda | ...................... H01L 25/18 257/76 |
| 2017/0104482 | A1* | 4/2017 | Springett | ......... H03K 17/04206 |
| 2017/0264286 | A1 | 9/2017 | Goto | |
| 2018/0013415 | A1* | 1/2018 | Ikeda | ..................... H03K 17/74 |

FOREIGN PATENT DOCUMENTS

| | | |
|---|---|---|
| JP | 2012-257421 | 12/2012 |
| JP | 2014-187726 | 10/2014 |
| JP | 5926003 | 5/2016 |
| JP | 2016-139996 | 8/2016 |
| JP | 2017-168924 | 9/2017 |
| JP | 6392458 B2 | 9/2018 |
| WO | WO 2017/009990 A1 | 1/2017 |
| WO | WO 2017/010554 A1 | 1/2017 |

* cited by examiner

*Primary Examiner* — Tomi Skibinski
(74) *Attorney, Agent, or Firm* — Oblon, McClelland, Maier & Neustadt, L.L.P.

(57) ABSTRACT

A semiconductor device according to an embodiment includes: a normally-off transistor having a first source, a first drain, and a first gate; a normally-on transistor having a second source electrically connected to the first drain, a second drain, and a second gate; a first capacitor having a first end and a second end, wherein the second end is electrically connected to the second gate; a first diode having a first anode electrically connected between the second end and the second gate, and a first cathode; a gate drive circuit electrically connected to the first gate and the first end; and a switch having a third end and a fourth end, wherein the third end is electrically connected to the first end.

8 Claims, 4 Drawing Sheets

SEMICONDUCTOR DEVICE

CROSS-REFERENCE TO RELATED APPLICATION

This application is based upon and claims the benefit of priority from Japanese Patent Application No. 2018-053571, filed on Mar. 20, 2018, the entire contents of which are incorporated herein by reference.

FIELD

Embodiments described herein relate generally to a semiconductor device.

BACKGROUND

Group III nitrides such as GaN (gallium nitride) based semiconductors are expected as materials for next generation power semiconductor devices. A GaN-based semiconductor has a larger band gap than Si (silicon). For this reason, compared to Si (silicon) semiconductor devices, GaN-based semiconductor devices can realize small and high-voltage power semiconductor devices. In addition, since a parasitic capacitance can be reduced by this, a high-speed drive power semiconductor device can be realized.

Generally, in a GaN-based transistor, a high electron mobility transistor (HEMT) structure using two-dimensional electron gas (2DEG) as a carrier is applied. A normal HEMT is a normally-on transistor which conducts without applying a voltage to a gate. Therefore, there is a problem that it is difficult to realize a normally-off transistor which does not conduct unless a voltage is applied to a gate.

In such as power supply circuits dealing with large electric power of several hundred voltage to one thousand voltage, normally-off operation is required with emphasis on safety. Therefore, a circuit configuration is proposed in which a normally-on GaN-based transistor and a normally-off Si transistor are cascode-connected to realize a normally-off operation.

A measure is required against erroneous turn-on that, even though the transistor is turned off, due to the influence of other transistors switching on and off, the transistor turns on when charge flows into a gate of the transistor via feedback capacitance of the transistor. As one of the measures, a mirror clamp circuit is proposed which fixes the gate potential of a transistor.

DETAILED DESCRIPTION

Embodiments of the present disclosure will be described below with reference to drawings. In the following description, the same reference signs are given to the same or similar members in some cases. In addition, as for the member once explained, its explanation may be omitted as appropriate.

In addition, in the present specification, a semiconductor device is based on a concept encompassing a power module in which a plurality of elements such as a discrete semiconductor is combined, an intelligent power module incorporating a drive circuit for driving these elements and a self-protection function in a plurality of elements such as a discrete semiconductor, or the whole system provided with the power module and the intelligent power module.

Further, in the present specification, the term "GaN-based semiconductor" is a generic term for semiconductors provided with gallium nitride (GaN), aluminum nitride (AlN), indium nitride (InN) and an intermediate composition thereof.

First Embodiment

A semiconductor device according to the first embodiment includes: a normally-off transistor having a first source, a first drain, and a first gate; a normally-on transistor having a second source electrically connected to the first drain, a second drain, and a second gate; a first capacitor having a first end and a second end, wherein the second end is electrically connected to the second gate; a first diode having a first anode electrically connected between the second end and the second gate, and a first cathode; a gate drive circuit electrically connected to the first gate and the first end; and a switch having a third end and a fourth end, wherein the third end is electrically connected to the first end.

Figure 1:
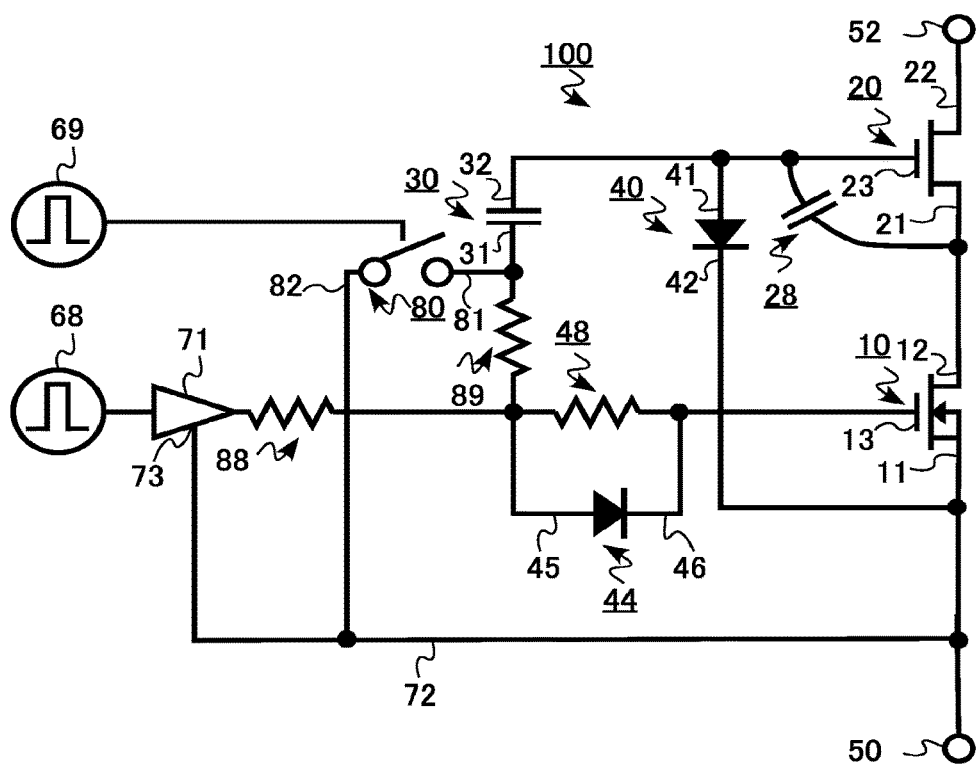
FIG. 1 is a circuit diagram of a semiconductor device according to a first embodiment.

FIG. 1 is a circuit diagram of a semiconductor device 100 according to the present embodiment. The semiconductor device 100 according to the present embodiment is, for example, a power module having a rated voltage of 600 V or 1200 V.

The semiconductor device 100 according to the present embodiment includes a normally-off transistor 10, a normally-on transistor 20, a first capacitor 30, a first diode 40, a first resistor 48, a second diode 44, a gate drive circuit 71, a first signal source 68, a second signal source 69, a source terminal 50, a drain terminal 52, and a switch 80.

The normally-off transistor 10 has a first source 11, a first drain 12, and a first gate 13.

The normally-off transistor 10 is a transistor in which drain current does not flow when no voltage is applied to a gate. The normally-off transistor 10 is, for example, a vertical metal-oxide semiconductor field-effect transistor (MOSFET) using a silicon (Si) semiconductor. Note that the normally-off transistor 10 includes a parasitic body diode (not illustrated).

The withstand voltage of the normally-off transistor 10 is, for example, 10 V or more and 30 V or less.

The normally-on transistor 20 has a second source 21, a second drain 22, and a second gate 23. The second source 21 is electrically connected to the first drain 12.

The normally-on transistor 20 is a transistor through which drain current flows even when no voltage is applied to a gate. The normally-on transistor 20 is, for example, a HEMT including a nitride semiconductor material such as a GaN-based semiconductor.

The withstand voltage of the normally-on transistor 20 is higher than the withstand voltage of the normally-off transistor 10. The withstand voltage of the normally-on transistor 20 is, for example, 600 V or more and 1200 V or less.

The semiconductor device 100 according to the present embodiment has a circuit configuration that realizes a normally-off operation by cascode connection in which the normally-off transistor 10 and normally-on transistor 20 are directly connected.

The first source 11 is electrically connected to the source terminal 50. The second drain 22 is electrically connected to the drain terminal 52.

The parasitic capacitance 28 is a gate-source parasitic capacitance of the normally-on transistor 20.

The first capacitor 30 has a first end 31 and a second end 32. The second end 32 is electrically connected to the second gate 23.

The first diode 40 has a first anode 41 and a first cathode 42. The first anode 41 is electrically connected between the second end 32 and the second gate 23.

In the semiconductor device 100 illustrated in FIG. 1, the first cathode 42 is electrically connected to the first source 11.

The first resistor 48 is electrically connected between the first end 31 and the first gate 13. In other words, the first resistor 48 is electrically connected between the gate drive circuit 71 to be described later and the first gate 13.

The second diode 44 has a second anode 45 and a second cathode 46. The second anode 45 is electrically connected to the first end 31 and the gate drive circuit 71 to be described later. In addition, the second cathode 46 is electrically connected to the first gate 13. The second diode 44 is provided in parallel to the first resistor 48.

The first signal source 68 outputs a signal such as a square wave, for example. The first signal source 68 is, for example, a commercially available signal source.

The gate drive circuit 71 outputs a signal for driving the normally-off transistor 10 and the normally-on transistor 20 based on the signal output from the first signal source 68.

In the semiconductor device 100 illustrated in FIG. 1, the gate drive circuit 71 is electrically connected to the first end 31 via a second resistor 88 and a third resistor 89. The second resistor 88 and the third resistor 89 are gate resistors.

In the semiconductor device 100 illustrated in FIG. 1, the gate drive circuit 71 is electrically connected to the first gate 13 via the first resistor 48 and the second diode 44.

The gate drive circuit 71 is an IC in which a plurality of elements is formed as one chip or an electronic circuit board on which a plurality of electronic parts are disposed.

The gate drive circuit 71 has a reference potential terminal (terminal) 73 for supplying a reference potential to the gate drive circuit 71. The reference potential terminal 73 is connected to the first source by using the gate drive circuit reference potential line 72. As a result, the reference potential of the gate drive circuit 71 becomes equal to the potential of the first source 11. The gate drive circuit reference potential line 72 is an example of "wiring".

The switch 80 has a third end 81 and a fourth end 82. The third end 81 is electrically connected to the first end 31. The fourth end 82 is electrically connected to the gate drive circuit reference potential line 72. It should be noted that the fourth end 82 may be connected to such as a ground other than the gate drive circuit reference potential line 72.

The switch 80 is, for example, a metal-oxide-semiconductor-field effect transistor (MOSFET).

The second signal source 69 outputs a signal to turn on/off the switch 80. The second signal source 69 is, for example, a commercially available signal source.

Next, the operation of the semiconductor device 100 according to the present embodiment will be described.

For example, by using the first signal source 68 and the gate drive circuit 71, the semiconductor device 100 outputs a square wave reciprocating between 0 V and a finite positive voltage $V_a$ that can turn on the normally-off transistor 10.

When $V_a$ is input to the first gate 13, the normally-off transistor 10 is turned on. In addition, when 0 V is input to the first gate 13, the normally-off transistor 10 is turned off.

When $V_a$ is output from the gate drive circuit 71, a current flows from the first capacitor 30 to the source terminal 50 via the first diode 40. At this time, a voltage corresponding to a forward voltage $V_F$ of the first diode 40 is input to the second gate 23. Therefore, the normally-on transistor 20 is turned on. On the other hand, when 0 V is output from the gate drive circuit 71, a current in the reverse direction flows through the parasitic capacitance 28 to the first capacitor 30. In general, since the forward voltage $V_F$ is small, a negative voltage ($V_F$–$V_a$) corresponding to the difference between $V_F$ and $V_a$ is input to the second gate 23. Therefore, the normally-on transistor 20 is turned off.

Here, when the semiconductor device 100 shifts from off to on, it is desirable that the normally-off transistor 10 be turned on earlier than the normally-on transistor 20. This is because, if the normally-on transistor 20 is turned on first, a high voltage is applied to a connection portion between the first drain 12 and the second source 21, and consequently there is a possibility that the characteristics of the normally-off transistor 10 with low withstand voltage deteriorate.

In the semiconductor device 100 according to the present embodiment, when the semiconductor device shifts from the off-state to the on-state, a current flows through the second diode 44 provided in parallel with the first resistor 48. Therefore, charging of the first gate 13 is not affected by the first resistor 48. Therefore, the first gate 13 can be quickly charged. Therefore, when the semiconductor device shifts from the off-state to the on-state, the normally-off transistor 10 can be reliably turned on earlier than the normally-on transistor 20.

By providing the first resistor 48, the off timing of the normally-off transistor 10 and the off timing of the normally-on transistor 20 can be delayed by a desired time. Therefore, when the semiconductor device shifts from the on-state to the off-state, the normally-on transistor 20 can be turned off earlier than the normally-off transistor 10.

Next, the operational effects of the semiconductor device according to the present embodiment will be described.

Similar to the semiconductor device according to the present embodiment, by providing a normally-off transistor having a first source, a first drain, and a first gate; a normally-on transistor having a second source electrically connected to the first drain, a second drain, and a second gate; a first capacitor having a first end and a second end, wherein the second end is electrically connected to the second gate; a first diode having a first anode electrically connected between the second end and the second gate, and a first cathode; a gate drive circuit electrically connected to the first gate and the first end; and a switch having a third end and a fourth end, wherein the third end is electrically connected to the first end, a semiconductor device can be provided in which erroneous turn-on is suppressed, and the normally-on transistor and the normally-off transistor are cascode-connected.

As a method of mirror-clamping the normally-on transistor 20, for example, a method is conceivable in which the second switch is turned on while the second gate 23 and the second source 21 are connected by such as a second switch, and mirror clamping is performed.

However, in the case of the semiconductor device 100 according to the present embodiment, as described above, due to signals input from the first signal source 68 and the gate drive circuit 71, via the first diode 40 and the parasitic capacitance 28, the gate potential and the source potential of the normally-on transistor 20 are greatly moved and do not become constant. Therefore, even if the second gate 23 and the second source 21 are connected by such as a switch, there is a problem that it is difficult to suppress erroneous turn-on of the normally-on transistor 20.

As another method of mirror-clamping the normally-on transistor 20, for example, a method of connecting a commercially available voltage source that generates a negative voltage to the second gate 23 via such as a third switch is conceivable. In this case, since the negative voltage is applied to the second gate 23 using the voltage source to mirror-clamp the normally-on transistor 20, the normally-on transistor 20 is turned off more reliably, and erroneous turn-on can be suppressed.

However, the semiconductor device 100 according to the present embodiment is driven by a first signal source 68 that outputs a square wave reciprocating between 0 V and a finite positive voltage $V_a$ that can turn on the normally-off transistor 10, and the semiconductor device 100 has a circuit configuration not using a power source for generating a negative voltage for turning off the normally-on transistor 20. Therefore, there is a problem that the circuit configuration becomes complicated if a power source for further applying a negative voltage for mirror clamping is provided.

Therefore, the semiconductor device 100 according to the present embodiment is provided with the switch 80 having the third end 81 and the fourth end 82. The third end 81 is electrically connected to the first end 31. Thus, it is possible to perform mirror clamping without providing a power source for applying a negative voltage, such that it is possible to obtain a semiconductor device having a relatively simple circuit configuration while suppressing erroneous turn-on and in which the normally-off transistor 10 and the normally-on transistor 20 are cascode-connected. The fourth end 82 may be electrically connected to the gate drive circuit reference potential line 72 or may be connected to another ground.

A MOSFET is preferably used as the switch 80.

Figure 2A:
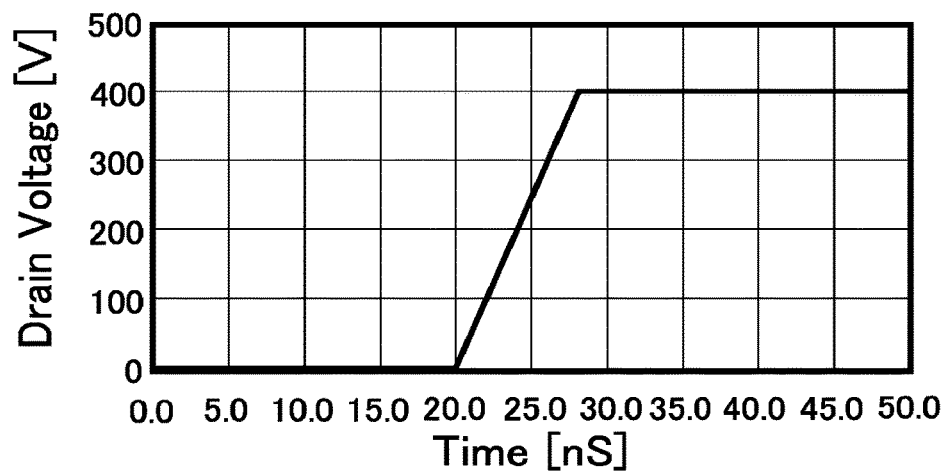
FIGS. 2A to 2C are schematic views of operational effects of the semiconductor device according to the first embodiment.
Figure 2B:
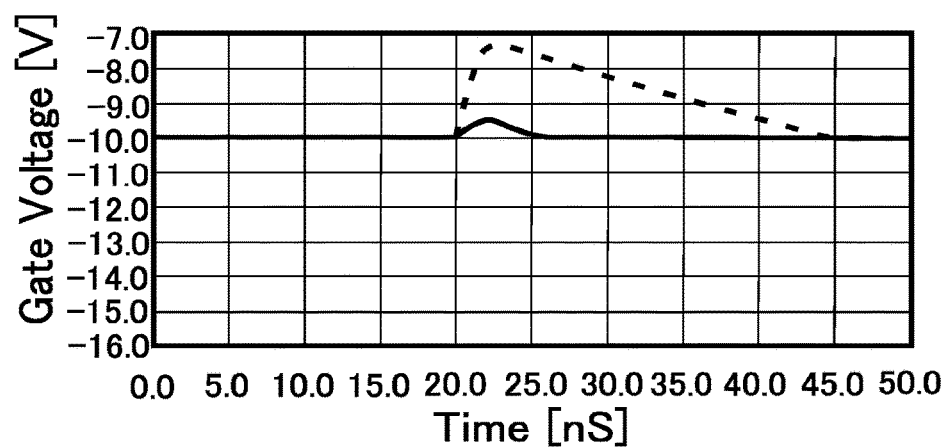
Figure 2C:
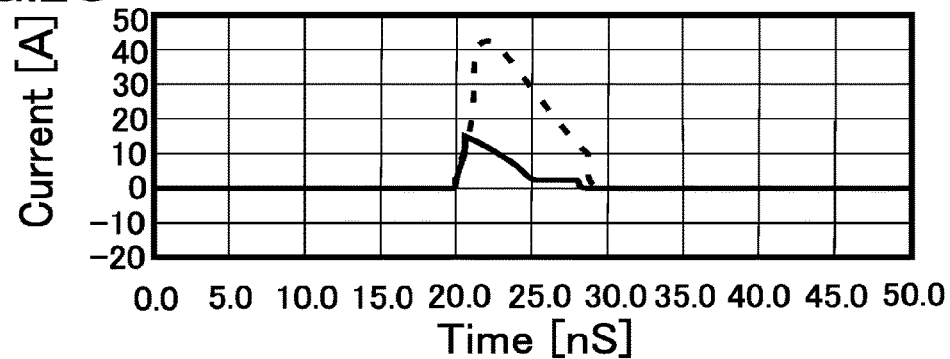

FIGS. 2A to 2C are schematic diagrams illustrating the operational effects of the semiconductor device 100 according to the present embodiment. Here, as illustrated in FIG. 2A, it is assumed that the drain voltage increases at a change rate of 50 V/ns when the transistor is turned off.

As illustrated in FIG. 2B, it is obvious that the gate voltage rise of the normally-on transistor 20 is suppressed in the case where the mirror clamping is not performed by the switch 80 indicated by a dotted line and the case where the mirror clamping is performed by the switch 80 indicated by a solid line. Accordingly, as illustrated in FIG. 2C, it is obvious that the current flowing due to erroneous turn-on is suppressed in the case where the mirror clamping is not performed by the switch 80 indicated by a dotted line and the case where the mirror clamping is performed by the switch 80 indicated by a solid line.

Figure 3:
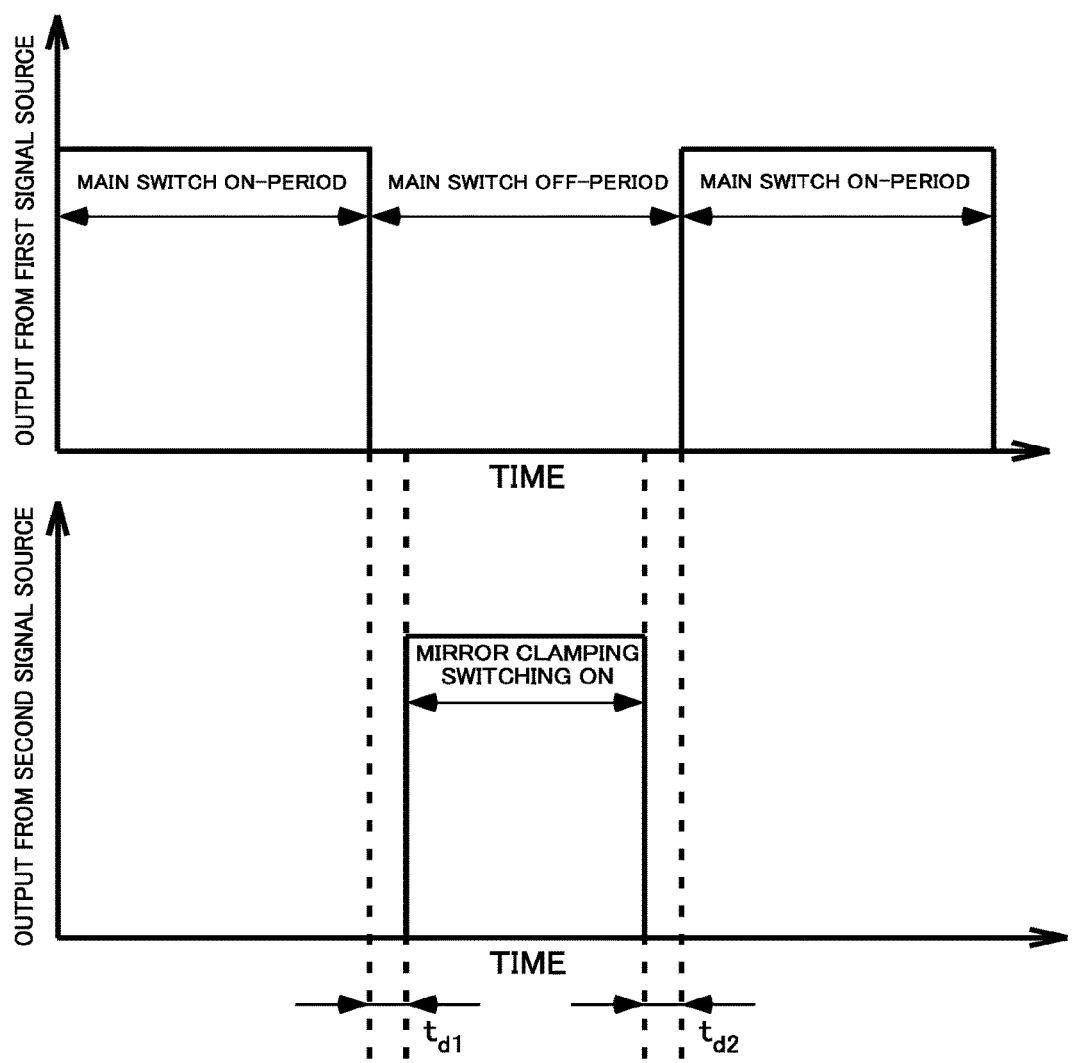
FIG. 3 is a schematic diagram of an example of a method of driving the semiconductor device according to the first embodiment.

FIG. 3 is a schematic diagram of an example of a driving method of the semiconductor device 100 according to the present embodiment.

While using the first signal source 68 to turn off the normally-off transistor 10 and the normally-on transistor 20, the second signal source 69 is used to turn on the switch 80. It should be noted that the switch 80 is not turned on during a time period when the normally-off transistor 10 and the normally-on transistor 20 are turned on.

The time $t_{d1}$ from when the normally-off transistor 10 and the normally-on transistor 20 are turned off until the switch 80 is turned on, and the time $t_{d2}$ from when the switch 80 is turned off until the normally-off transistor 10 and the normally-on transistor 20 are turned on are appropriately controlled in consideration of the value of such as the gate resistance on the basis of the time when it is desired to turn on or off the normally-off transistor 10 and the normally-on transistor 20.

According to the semiconductor device 100 of the present embodiment, it is possible to provide a semiconductor device in which erroneous turn-on is suppressed, and a normally-off transistor and a normally-on transistor are cascode-connected.

Second Embodiment

A semiconductor device according to the second embodiment is different from the semiconductor device according to the first embodiment in that a first cathode is electrically connected to a second source. The description of contents described in the first embodiment will be omitted herein.

Figure 4:
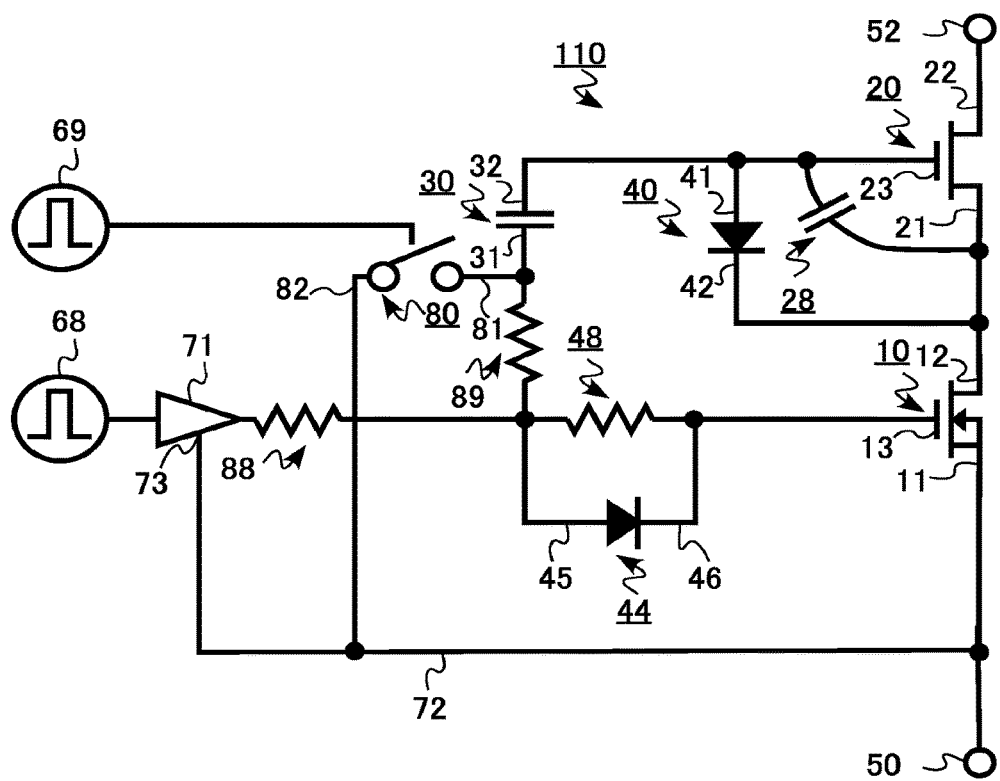
FIG. 4 is a circuit diagram of a semiconductor device of a second embodiment.

FIG. 4 is a circuit diagram of a semiconductor device 110 according to the present embodiment.

The semiconductor device 110 according to this embodiment also includes a switch 80 having a third end 81 and a fourth end 82, and the third end 81 is electrically connected to a first end 31. Thus, it is possible to perform mirror clamping without providing a power source for applying a negative voltage, such that it is possible to obtain a semiconductor device having a relatively simple circuit configuration while suppressing erroneous turn-on and in which a normally-off transistor 10 and a normally-on transistor 20 are cascode-connected.

According to the semiconductor device 110 of the present embodiment, it is possible to provide a semiconductor device in which erroneous turn-on is suppressed, and a normally-off transistor and a normally-on transistor are cascode-connected.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normally-off transistor having a first source, a first drain, and a first gate;
   a normally-on transistor having a second source electrically connected to the first drain, a second drain, and a second gate;
   a first capacitor having a first end and a second end, the second end electrically connected to the second gate;
   a first diode having a first anode electrically connected between the second end and the second gate, and a first cathode;
   a gate drive circuit electrically connected to the first gate and the first end; and
   a switch having a third end and a fourth end, the third end electrically connected to the first end.

2. The device according to claim 1, wherein the gate drive circuit comprises a terminal for supplying a reference potential to the gate drive circuit, and the terminal is connected to the first source by using a wiring.

3. The device according to claim 2, wherein the fourth end connected to the wiring.

4. The device according to claim 1, further comprising:
   a first resistor electrically connected between the first end and the first gate; and
   a second diode having a second anode electrically connected to the first end and a second cathode electrically connected to the first gate, the second diode provided in parallel to the first resistor.

5. The device according to claim 1, wherein the switch is a MOSFET.

6. The device according to claim 1, wherein the first cathode electrically connected to the first source.

7. The device according to claim 1, wherein the first cathode electrically connected to the second source.

8. The device according to claim 1, wherein the normally-on transistor includes a nitride semiconductor material.

\* \* \* \* \*